United States Patent
Troy et al.

(10) Patent No.: US 8,921,165 B2
(45) Date of Patent: Dec. 30, 2014

(54) ELIMINATION OF SILICON RESIDUES FROM MEMS CAVITY FLOOR

(75) Inventors: Brian I. Troy, San Mateo, CA (US);
Mickael Renault, San Jose, CA (US);
Thomas L. Maguire, Sunnyvale, CA (US); Joseph Damian Gordon Lacey, Milpitas, CA (US); James F. Bobey, Gilroy, CA (US)

(73) Assignee: Cavendish Kinetics, Inc., San Jose, CA (US)

( * ) Notice: Subject to any disclaimer, the term of this patent is extended or adjusted under 35 U.S.C. 154(b) by 195 days.

(21) Appl. No.: 13/565,693

(22) Filed: Aug. 2, 2012

(65) Prior Publication Data

US 2013/0032453 A1 Feb. 7, 2013

Related U.S. Application Data

(60) Provisional application No. 61/514,823, filed on Aug. 3, 2011.

(51) Int. Cl.

| | |
|---|---|
| H01L 21/82 | (2006.01) |
| H01L 21/66 | (2006.01) |
| G01R 31/26 | (2014.01) |
| H01L 21/00 | (2006.01) |
| H01L 23/28 | (2006.01) |
| G01P 15/08 | (2006.01) |
| H01L 21/70 | (2006.01) |
| B81C 1/00 | (2006.01) |
| H01H 1/00 | (2006.01) |

(52) U.S. Cl.
CPC .......... *B81C 1/00484* (2013.01); *H01H 1/0036* (2013.01); *B81B 2201/018* (2013.01); *B81B 2203/0118* (2013.01); *H01H 2001/0089* (2013.01)
USPC .............. 438/128; 438/15; 438/50; 257/787; 257/417; 257/499

(58) Field of Classification Search
USPC ................. 257/416, 644, 510, 635, 417, 787, 257/E29.324, E21.002, 499; 438/50, 127, 438/151, 51, 111
See application file for complete search history.

(56) References Cited

U.S. PATENT DOCUMENTS

| | | | | |
|---|---|---|---|---|
| 5,652,559 | A | * | 7/1997 | Saia et al. ......................... 335/78 |
| 5,994,161 | A | * | 11/1999 | Bitko et al. ...................... 438/53 |

(Continued)

OTHER PUBLICATIONS

International Search Report and Written Opinion dated Jan. 18, 2013 for PCT Application No. PCT/US2012/049497, 13 pages.

*Primary Examiner* — Evan Pert
*Assistant Examiner* — Gustavo Ramallo
(74) *Attorney, Agent, or Firm* — Patterson & Sheridan, LLP

(57) ABSTRACT

The present invention generally relates to a MEMS device in which silicon residues from the adhesion promoter material are reduced or even eliminated from the cavity floor. The adhesion promoter is typically used to adhere sacrificial material to material above the substrate. The adhesion promoter is the removed along with then sacrificial material. However, the adhesion promoter leaves silicon based residues within the cavity upon removal. The inventors have discovered that the adhesion promoter can be removed from the cavity area prior to depositing the sacrificial material. The adhesion promoter which remains over the remainder of the substrate is sufficient to adhere the sacrificial material to the substrate without fear of the sacrificial material delaminating. Because no adhesion promoter is used in the cavity area of the device, no silicon residues will be present within the cavity after the switching element of the MEMS device is freed.

14 Claims, 6 Drawing Sheets

(56) References Cited

U.S. PATENT DOCUMENTS

| | | | |
|---|---|---|---|
| 6,798,029 B2 * | 9/2004 | Volant et al. | 257/415 |
| 7,148,436 B1 * | 12/2006 | Lee et al. | 200/61.48 |
| 8,289,674 B2 * | 10/2012 | Smith et al. | 361/271 |
| 2010/0237738 A1 | 9/2010 | Smith et al. | |

* cited by examiner

ELIMINATION OF SILICON RESIDUES FROM MEMS CAVITY FLOOR

CROSS-REFERENCE TO RELATED APPLICATIONS

This application claims benefit of U.S. Provisional Patent Application Ser. No. 61/514,823, filed Aug. 3, 2011, which is herein incorporated by reference.

BACKGROUND OF THE INVENTION

1. Field of the Invention

Embodiments of the present invention generally relate to a micro electro-mechanical system (MEMS) device and a method for its fabrication.

2. Description of the Related Art

MEMS devices typically include a switching element that is movable between multiple positions, such as between a position in close contact with an electrode and a position spaced from the electrode. FIGS. 1A-1D are schematic cross-sectional views of a MEMS device 100 at various stages of fabrication according to the prior art. The MEMS device 100 includes a substrate 102 having a plurality of electrodes 104, 106, 108 embedded therein. A dielectric layer 110 is disposed over the substrate 102 and electrodes 104, 106, 108.

For MEMS that utilize an organic polymer as their sacrificial material, the adhesion of the first layer of the sacrificial material to underlying dielectrics is typically low. In order to fix the low adhesion issue, a silicon polymer is often added to the polymer system. However, the Si, upon removal of the organic sacrificial material, can leave residues behind that can be detrimental to the performance of the MEMS device. As an alternative to adding silicon to the sacrificial material, an independent adhesion promoter material can be used. The adhesion promoter is coated over the substrate, either through a spin-on or CVD type process, prior to the coating of the organic sacrificial material. If inorganic material is used as the sacrificial material, an adhesion promoter would not be utilized.

An adhesion promoter layer 112 is then deposited over the dielectric layer 110. The adhesion promoter layer 112 is used to adhere sacrificial material thereon. A first sacrificial material layer 116A is then deposited on the adhesion promoter layer 112. The first sacrificial material layer 116A is an organic sacrificial material comprising carbon, hydrogen, nitrogen and oxygen. The first sacrificial material layer 116A, the adhesion promoter layer 112 and the dielectric layer 110 are then patterned to expose the electrode 104. As shown in FIG. 1B, an electrical conductive material is then deposited and patterned to form the switching element 118. A second sacrificial material layer 116B is then deposited over the switching element 118. The second sacrificial material layer 116B and the first sacrificial material layer 116A are then patterned using standard semiconductor processing techniques. The cavity 114 is bound by a roof 120, walls 122 and the dielectric layer 110 as shown in FIG. 1C.

As shown in FIG. 1D, the first and second sacrificial material layers 116A, 116B as well as the adhesion promoter layer 112 are then removed to free the switching element 118 within the cavity 114 so that the switching element 118 may move from a position spaced from the electrode 106 to a position in close proximity to the electrode 106 (i.e., in contact with the dielectric layer 110) as shown by arrow "A". The first and second sacrificial material layers 116A, 116B are removed by etching using an $H_2/O_2$ chemistry introduced through a release hole (not shown) formed in the roof 120 or in through a hole in the side of the cavity. Any silicon contained in the organic sacrificial material would not be etched and would thus remain in the cavity as residues 124. The residues 124 are believed to be remnants of the adhesion promoter layer 112 or silicon that may be present in the sacrificial material. Specifically, silicon present in the adhesion promoter layer 112 or within the sacrificial material may lead to nanoscopic silicon (i.e., silicon with a vacancy in the 1 s orbital), which is very prone to charging. The residues 124 can interfere with the MEMS device 100 performance by mechanically impeding the switching element 118 from moving into close proximity to the electrode 106. The residue can also alter the electrical switching behavior of the MEMS device 100 by storing charge within the silicon that results in a hysteresis loop narrowing, where the difference between the pull-in voltage applied to electrode 108 which causes the cantilever it be pulled down and that at which the cantilever releases back up, gets smaller.

Therefore, there is a need in the art for a MEMS device and a method for its manufacture in which residues do not interfere with device performance.

SUMMARY OF THE INVENTION

The present invention generally relates to a MEMS device in which silicon residues from the adhesion promoter material are reduced or even eliminated from the cavity floor. The adhesion promoter is typically used to adhere sacrificial material to the underlying layer. The adhesion promoter is then removed along with the sacrificial material. However, the adhesion promoter leaves silicon based residues within the cavity upon removal. The inventors have discovered that the adhesion promoter can be removed from the cavity area prior to depositing the sacrificial material. The adhesion promoter which remains over the remainder of the substrate is outside of the region where the MEMS device is formed is sufficient to adhere the sacrificial material to the substrate for fabrication of the portion of the MEMS device overlying the electrodes without fear of the sacrificial material delaminating from the substrate. Because no adhesion promoter is used in the cavity area of the device, no silicon residues will be present within the cavity after the switching element of the MEMS device is freed by removing the sacrificial material.

In one embodiment, a method of fabricating a MEMS device is disclosed. The method includes depositing an adhesion promoter layer over a substrate having a first portion to be enclosed within a cavity and a second portion to be disposed outside the cavity, removing the adhesion promoter layer in the area disposed over the first portion, depositing a sacrificial layer over the adhesion promoter layer and the first portion of the substrate, forming a switching element above the sacrificial layer, enclosing the switching element within the cavity and removing the sacrificial layer.

In another embodiment, a method of fabricating a MEMS device over a substrate having a first portion and a second portion is disclosed. The method includes selectively forming an adhesion promoter layer over the first portion of the substrate, forming a sacrificial layer over the adhesion promoter layer and the second portion of the substrate, forming a switching element over the sacrificial layer and the second portion of the substrate, enclosing the switching element within a cavity that is at least partially bound by the second portion of the substrate and removing the sacrificial layer.

In another embodiment, a device includes a substrate having a first portion at least partially bounding a cavity and a second portion disposed outside the cavity, an adhesion promoter layer disposed over the second portion of the substrate, wherein the adhesion promoter layer is not disposed over the first portion. The device also includes a switching element disposed within the cavity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a MEMS device in which silicon residues from the adhesion promoter material are reduced or even eliminated from the cavity floor. The adhesion promoter is typically used to adhere sacrificial material to its underlying layer. The adhesion promoter is then removed along with the sacrificial material. However, the adhesion promoter leaves silicon based residues within the cavity upon removal. As discussed herein, the adhesion promoter can be removed from the cavity area prior to depositing the sacrificial material. The adhesion promoter which remains over the remainder of the substrate is sufficient to adhere the sacrificial material to the substrate without fear of the sacrificial material delaminating. Because no adhesion promoter is used in the cavity area of the device, no silicon residues will be present within the cavity after the switching element of the MEMS device is freed.

Figure 1A:
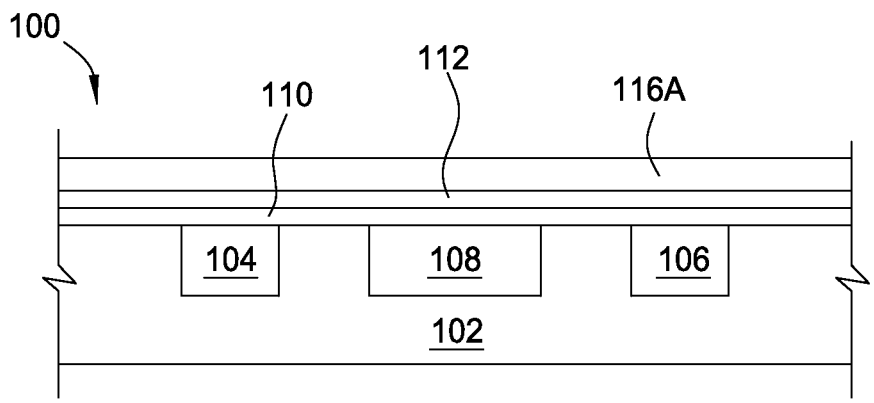
FIGS. 1A-1D are schematic cross-sectional views of a prior art MEMS device 100 at various stages of production.
Figure 1B:
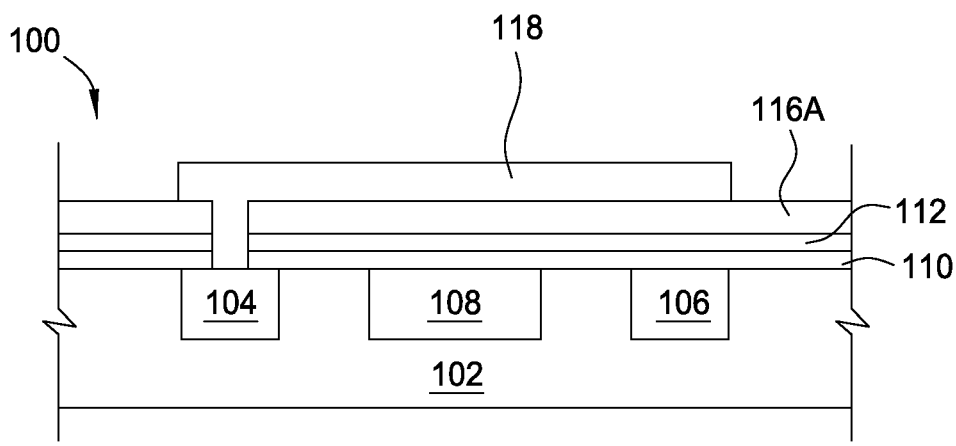
Figure 1C:
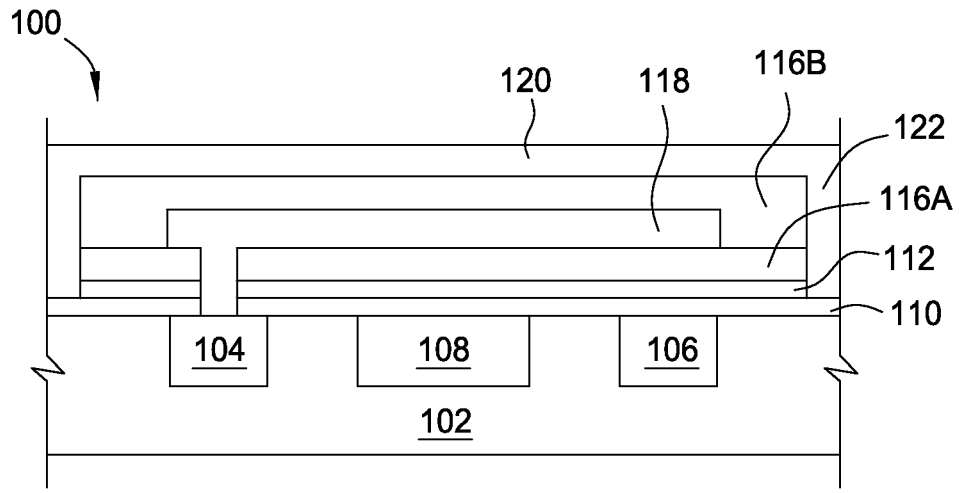
Figure 1D:
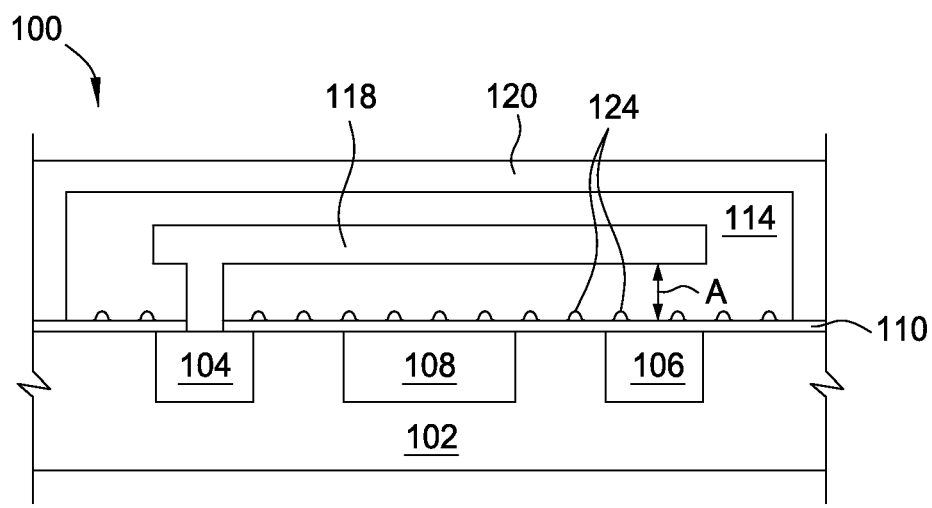
Figure 2A:
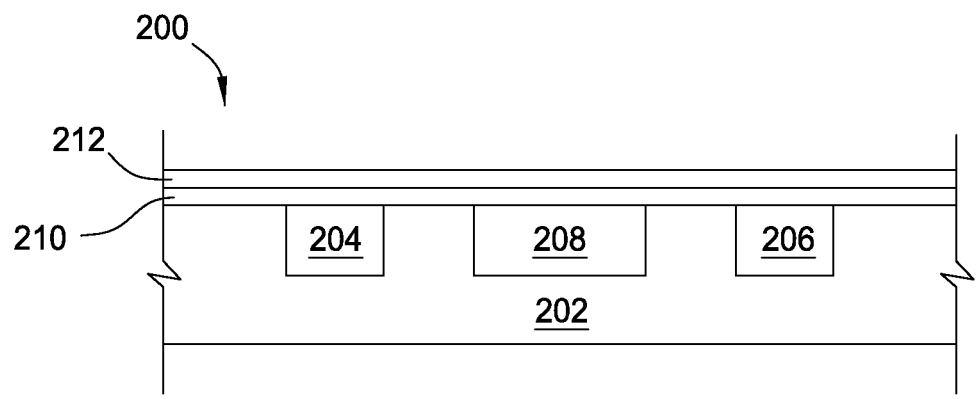
FIGS. 2A-2G are schematic cross-sectional views of a MEMS device 200 at various stages of production.

FIGS. 2A-2G are schematic cross-sectional views of a MEMS device 200 at various stages of production. As shown in FIG. 2A, the MEMS device 200 includes a substrate 202 having several structures embedded therein. There is an electrical connection 204 that provides electrical connection from the device 200 to layers below the substrate 202. There is also a pull-in electrode 208 that is used to pull the later formed switching element 222 (See FIGS. 2F and 2G) from a position spaced a first distance from the RF electrode 206 to a second distance closer to the RF electrode 206. The electrical connection 204, pull-in electrode 208 and the RF electrode 206 may all be formed by removing material from the substrate 202 by a process such as etching, blanket depositing an electrically conductive material into the etched region of the substrate, and removing excess electrically conductive material from the surface of the substrate by a process such as etching or chemical mechanical polishing. Suitable electrically conductive material that may be used include copper, aluminum, titanium, tungsten, titanium nitride, titanium aluminum nitride, combinations thereof and other well known electrically conductive materials traditionally utilized in the back end of the line (BEOL) of a complementary metal oxide semiconductor (CMOS) manufacturing process. The substrate material that the electrically conductive material is formed within may include electrically insulating material such as silicon oxide, silicon nitride, silicon oxynitride, and combinations thereof. Alternatively, the electrical connection 204, pull-in electrode 208 and the RF electrode 206 may all be formed by first blanket depositing an electrically conductive material over the substrate 202. Thereafter, excess portions of the electrically conductive material are removed by a process such as etching to form the final shape of the electrical connection 204, pull-in electrode 208 and the RF electrode 206.

As shown in FIG. 2A, an electrically insulating layer 210, followed by adhesion promoter layer 212, may be deposited over the exposed substrate 202 and electrical connection 204, pull-in electrode 208 and the RF electrode 206 by a blanket deposition process. Excess electrically insulating material may then be removed by a process such as etching or CMP. The electrically insulating layer 210 prevents shorting between the switching element 222 and the pull-in electrode 208.

The adhesion promoter layer 212 is then deposited over the electrically insulating layer 210. The adhesion promoter layer 212 may be deposited to a thickness of less than 20 nm, such as between about 4 nm and about 20 nm, or about 6 nm. Suitable materials that may be utilized for the adhesion promoter layer 212 include a compound comprising silicon covalently bonded to an organic functionality, such as AP3000, AP4000 and AP6300 which are available from Dow Chemical, which are, in general, organoxilane based to form the correct bonding termination between $SiO_2$ and the organic sacrificial material. The adhesion promoter layer 212 is tailored to the specific film that requires improved adhesion. In general, the adhesion promoter layer 212 contains about 29 atomic percent silicon, with an upper limit of 30 atomic percent silicon. The adhesion promoter layer 212 is utilized to adhere the sacrificial layer 220 to the device 200. In the absence of the adhesion promoter layer 212, the sacrificial layer 220 would delaminate from the device 200. The adhesion promoter layer 212 may be deposited by a spin-on process.

Figure 2B:
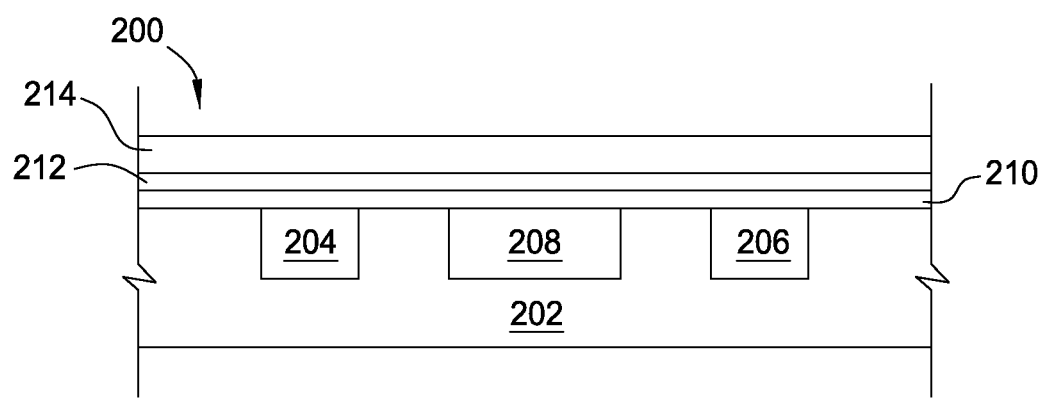
Figure 2C:
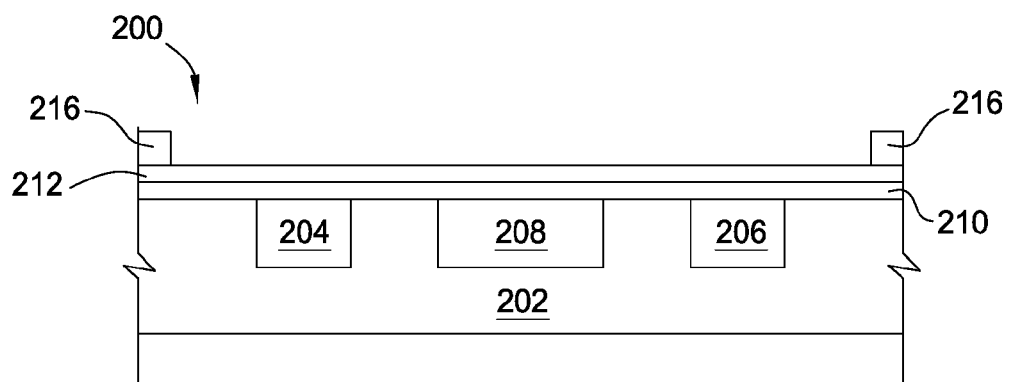
Figure 2D:
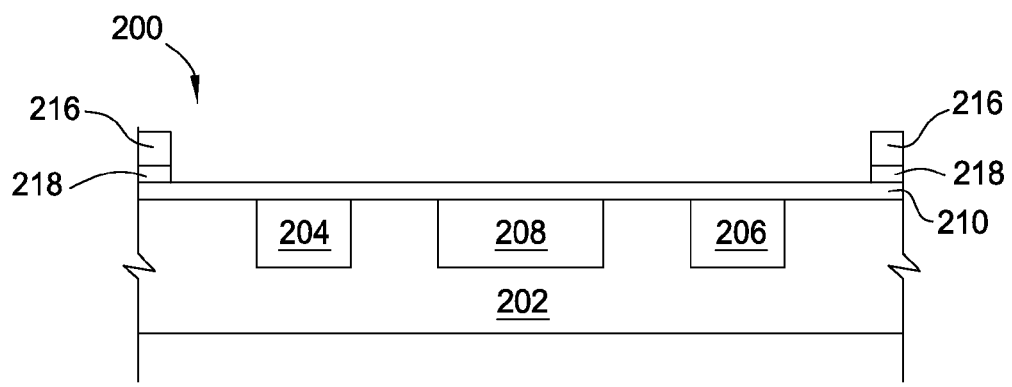

As discussed above, the adhesion promoter layer 212 can be the source of residues within the cavity 226. Thus, the adhesion promoter layer 212 is removed from the cavity 226 prior to depositing the sacrificial layer 220. The adhesion promoter layer 212 will remain over the substrate 202 in the areas outside of the cavity 226. It is to be understood that some residual adhesion promoter layer 212 may remain within the cavity 226 even after the removal process. The residual adhesion promoter layer 212 should not be under the MEMS area or even the MEMS touchdown area of the switching element 222 so that if any residues form, the residues do not alter the landing properties of the MEMS device. In order to remove the adhesion promoter layer 212, a photoresist layer 214 is deposited over the adhesion promoter layer 212 as shown in FIG. 2B and then patterned to form a mask 216 as shown in FIG. 2C. The opening in the mask 216 corresponds to the portions of the adhesion promoter layer 212 that will be removed prior to deposition of the sacrificial material. The exposed adhesion promoter layer 212 is etched to leave a pattern on the substrate of adhesion promoter layer 218 in the areas outside the region of the electrodes 204, 206 and 210 and no adhesion promoter layer 212 within the region of electrodes 204, 206 and 210 as shown in FIG. 2D. The remaining, patterned adhesion promoter layer 218 will be sufficient to adhere the sacrificial layer 220 to the substrate 202 without permitting the sacrificial layer 220 to delaminate before formation of a switching element (See FIG. 2F). If the adhesion promoter layer 212 were to remain over the electrodes 206, 208, the adhesion promoter material would act as a charge trap resulting in a reduction in device reliability and lifetime.

In absence of the patterned adhesion promoter layer 218, the sacrificial layer 220 would delaminate over the large area of the substrate 202 when the sacrificial layer 220 is wet-processed. The area of the un-patterned adhesion promoter layer 218 is sufficiently large as compared to the cavity 226 that the remaining adhesion promoter layer 218 will hold down the sacrificial layer 220 over the remaining portions of the wafer.

Figure 2E:
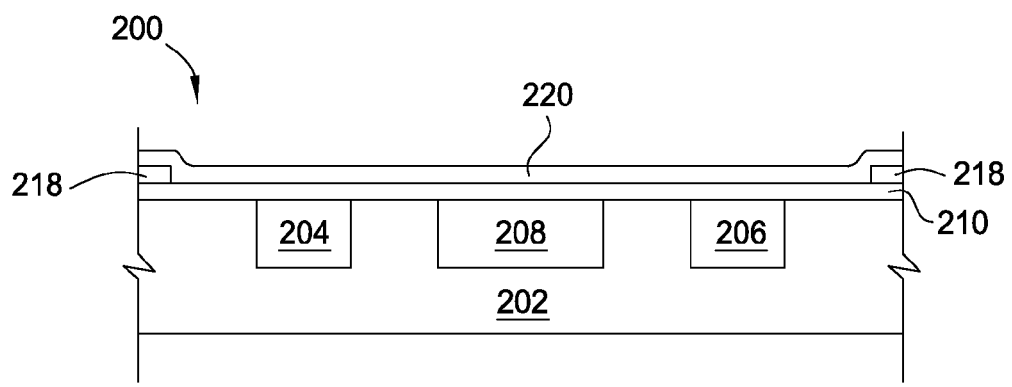

Once the patterned adhesion promoter layer 218 is formed, the mask 216 is removed by a well known process such as ashing or wet etching, and the sacrificial layer 220 is deposited as shown in FIG. 2E. Suitable materials that may be used for the sacrificial layer 220 include on organic based dielectric containing a long chain molecule with a carbon backbone. Specific materials that may be used for the sacrificial layer 220 includes polyarylene or polyphenylene based polymers such as SILK™ available from Dow Chemical or the LKD 7200 series from JSR. The organic functionality of the patterned adhesion promoter layer 218 provides the necessary bonding functionality for the sacrificial layer 220. The sacrificial layer 220 may be deposited by a spin-on process and then cured. The patterned adhesion promoter layer 218 provides adequate adhesion for the spin-on sacrificial layer 220 to permit the sacrificial layer 220 to survive the remainder of the MEMS device 200 process steps. Once the sacrificial layer 220 is deposited, it is patterned and the remainder of the device 200 is formed.

A switching element 222 is formed over the sacrificial layer 220 and another sacrificial layer 224 is formed over the switching element 222 to embed the switching element 222 within sacrificial material. No extra adhesion layer is required at this stage as most of the second sacrificial layer lies on the first sacrificial layer, however if an adhesion layer was required, such an adhesion layer could be patterned so as not to remain in the cavity area. The switching element 222 is formed by blanket depositing an electrically conductive material, forming a mask thereover, etching the electrically conductive material to form the switching element 222, and then removing the mask by a well known process such as ashing or etching. The switching element 222 is electrically connected to electrical connection 204.

Figure 2F:
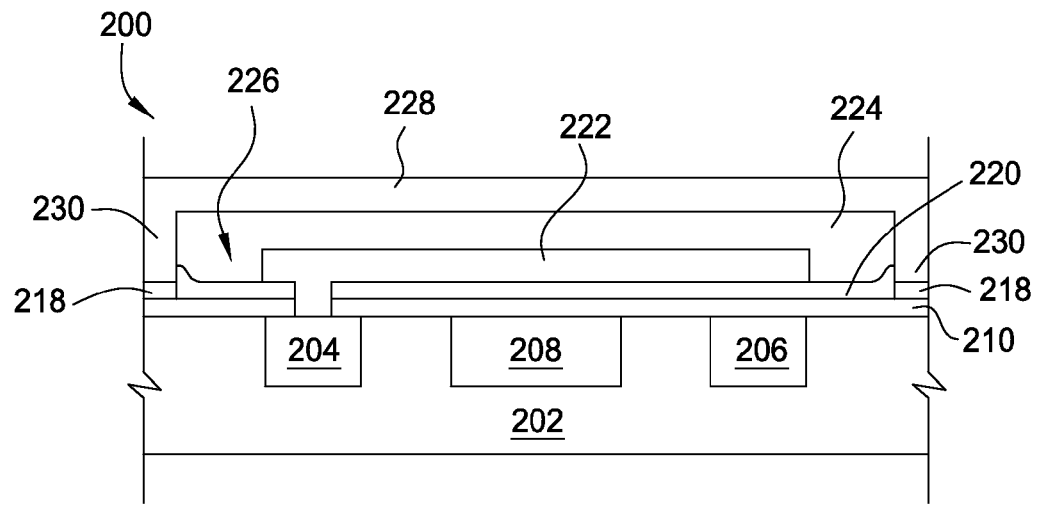
Figure 2G:
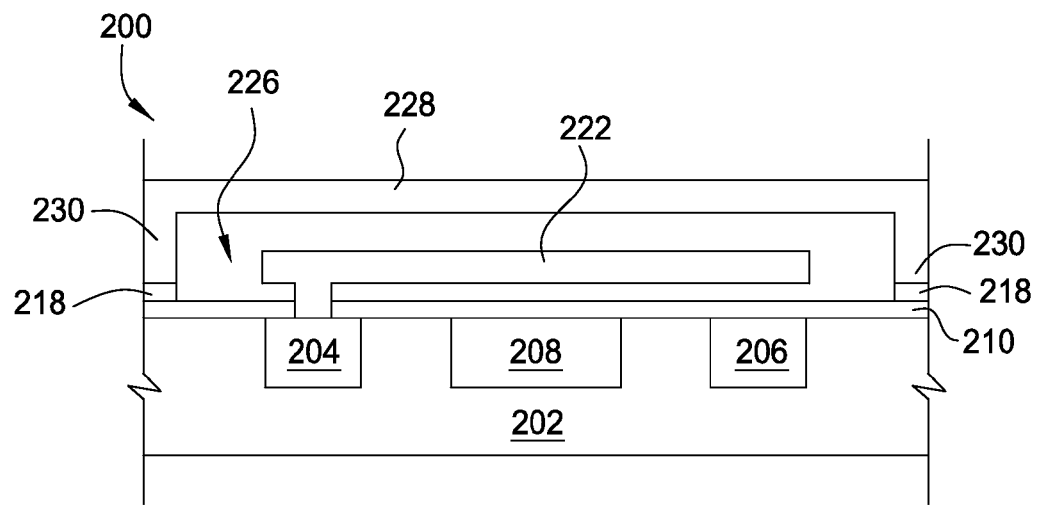

Once all of the sacrificial material has been deposited and patterned to define the interior shape of the cavity 226, the cavity 226 may be encapsulated such that a roof 228 and walls 230 are present as shown in FIG. 2F. An opening may be formed through one or more of the roof 228 and the walls 230 in order to introduce an etchant that will remove the sacrificial layers 220, 224 and free the switching element 222 to move within the cavity 226. The sacrificial layers 220, 224 are removed by an anisotropic plasma etching process. As can be seen from FIG. 2G, because the adhesion promoter layer 212 was removed from the cavity 226 prior to depositing the sacrificial layer 220, there are no residues within the cavity 226 and the switching element is not obstructed by residues or repulsive charging of the electrically insulating layer 210.

It is to be understood that while the switching element 222 has been shown as a cantilever structure having a free end and a fixed end that is coupled to the electrical connection 204, the invention is not restricted to such a switching element. The invention is equally applicable to other switching elements such as a switching element that is fixed at opposite ends with an electrical connection at the ends and a flexible bridge between the fixed ends that is movable between a position spaced from an RF electrode and a position is close proximity to the RF electrode. Suitable materials that may be used for the switching element 222 include titanium nitride, titanium aluminum, tungsten, copper, titanium aluminum nitride aluminum and combinations thereof and multilayer structures such as titanium nitride-aluminum-titanium nitride or an oxide-titanium aluminum nitride-oxide stack. The switching element 222 may be formed by depositing electrically conductive material by a method such as physical vapor deposition (PVD) and then patterning the electrically conductive material by a process such as etching. If desired, an electrically insulating material may be formed on one or more of the top surface and the bottom surface of the switching element 222.

Figure 3A:
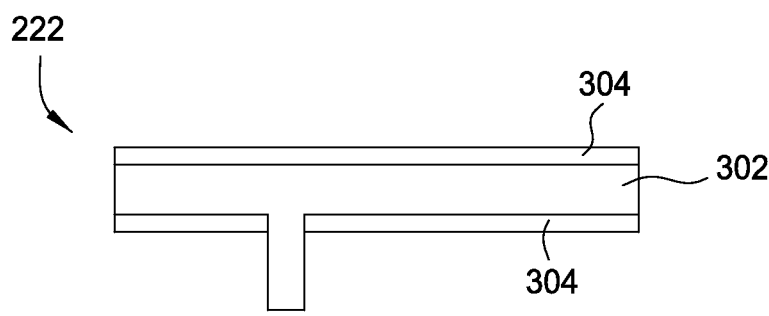
FIGS. 3A and 3B are examples of switching elements 222 that may be utilized in the embodiments discussed herein.
Figure 3B:
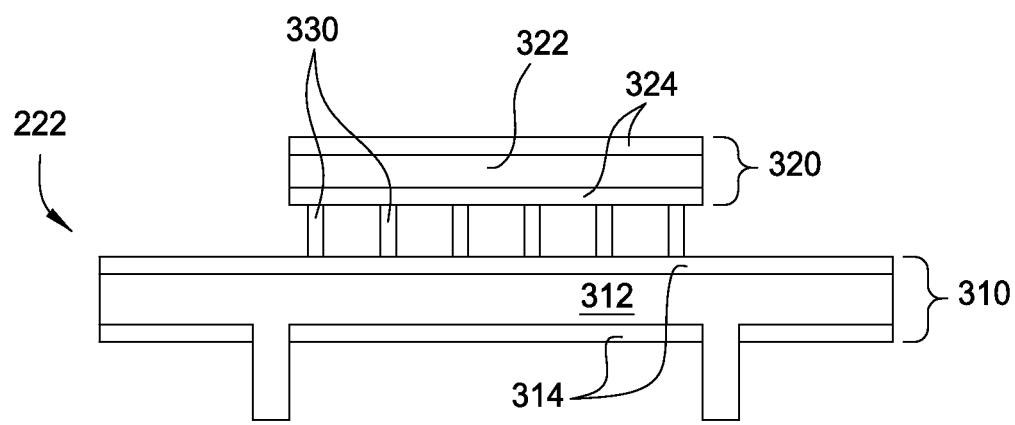

FIGS. 3A and 3B are examples of switching elements 222 that may be utilized in the embodiments discussed herein. In FIG. 3A, the switching element 222 includes a plurality of dielectric layers 304 that at least partially encapsulate the conductive portion 302 of the switching element 222. The dielectric layers 304 are thinner than the conductive portion 302. The dielectric layers 304 are beneficial because the sacrificial material would otherwise interact with exposed conductive material to produce non-volatile residues which would remain in the cavity 226. When the conductive portion 302 are at least partially isolated from the cavity 226 by encapsulating them with dielectric layers 304 (e.g., oxide material such as silicon dioxide), the amount of post release residue is significantly decreased or eliminated altogether.

FIG. 3B shows a switching element 222 according to another embodiment. The switching element 222 has a waffle-like structure in which a bottom portion 310 is coupled to a top portion 320 by one or more electrically conductive posts 330. The bottom portion 310 includes a conductive portion 312 that is surrounded by a plurality of dielectric layers 314 that at least partially encapsulate the conductive portion 312. Similarly, the top portion 320 includes a conductive portion 322 that is surrounded by a plurality of dielectric layers 324 that at least partially encapsulate the conductive portion 322.

By utilizing an adhesion promoter layer in the areas of the MEMS device that are outside of the device cavity, the sacrificial layer may be deposited and adhered without fear of delimitation during further MEMS processing. Without the silicon based adhesion layer within the cavity, silicon residues are reduced or even eliminated. Thus, the MEMS device may be fabricated with the necessary sacrificial material without fear of the sacrificial material delaminating or adhesion material residue interfering with mechanical or electrical operation of the MEMS device.

It is to be understood that the adhesion promoter layer may be removed and/or not present within the cavity area according to other methods as well. For example, it is contemplated that a mask may be formed over the dielectric layer. The mask has the desired shape of the bottom of the cavity. The adhesion promoter is then blanket deposited over the substrate. The mask, with adhesion promoter material thereon, is then removed such that the desired areas do not have adhesion promoter thereover.

While the foregoing is directed to embodiments of the present invention, other and further embodiments of the invention may be devised without departing from the basic scope thereof, and the scope thereof is determined by the claims that follow.

The invention claimed is:

1. A method of fabricating a MEMS device, comprising:
depositing an adhesion layer over a substrate having a first portion to be enclosed within a cavity and a second portion to be disposed outside the cavity;
removing the adhesion layer in the area disposed over the first portion;
depositing a sacrificial layer on and in contact with the adhesion layer and the first portion of the substrate;
forming a switching element above the sacrificial layer;
enclosing the switching element within the cavity; and
removing the sacrificial layer.

2. A method of fabricating a MEMS device, comprising:
depositing an adhesion layer over a substrate having a first portion to be enclosed within a cavity and a second portion to be disposed outside the cavity;
removing the adhesion layer in the area disposed over the first portion;
depositing a sacrificial layer over the adhesion layer and the first portion of the substrate;
forming a switching element above the sacrificial layer;
enclosing the switching element within the cavity; and
removing the sacrificial layer, wherein the adhesion layer comprises silicon.

3. A method of fabricating a MEMS device, comprising:
depositing an adhesion layer over a substrate having a first portion to be enclosed within a cavity and a second portion to be disposed outside the cavity;
removing the adhesion layer in the area disposed over the first portion;
depositing a sacrificial layer over the adhesion layer and the first portion of the substrate;
forming a switching element above the sacrificial layer;
enclosing the switching element within the cavity; and
removing the sacrificial layer, wherein the adhesion layer comprises silicon wherein the sacrificial layer comprises a dielectric material.

4. The method of claim 3, wherein the dielectric material is an organic dielectric material.

5. A method of fabricating a MEMS device, comprising:
depositing an adhesion layer over a substrate having a first portion to be enclosed within a cavity and a second portion to be disposed outside the cavity;
removing the adhesion layer in the area disposed over the first portion;
depositing a sacrificial layer over the adhesion layer and the first portion of the substrate;
forming a switching element above the sacrificial layer;
enclosing the switching element within the cavity; and
removing the sacrificial layer, wherein removing the adhesion layer comprises:
depositing a photoresist layer over the adhesion layer;
exposing select areas the photoresist layer that correspond to the first portion of the substrate;
developing the photoresist layer to remove the select areas of the photoresist layer and thereby form a mask and expose the adhesion layer in the area disposed over the first portion
etching the exposed adhesion layer.

6. The method of claim 5, further comprising depositing an electrically insulating layer over the substrate prior to depositing the adhesion layer.

7. A method of fabricating a MEMS device, comprising:
depositing an adhesion layer over a substrate having a first portion to be enclosed within a cavity and a second portion to be disposed outside the cavity;
removing the adhesion layer in the area disposed over the first portion;
depositing a sacrificial layer over the adhesion layer and the first portion of the substrate;
forming a switching element above the sacrificial layer;
enclosing the switching element within the cavity; and
removing the sacrificial layer, wherein the adhesion layer comprises silicon covalently bonded to an organic material.

8. A method of fabricating a MEMS device over a substrate having a first portion and a second portion, comprising:
selectively forming an adhesion layer over the first portion of the substrate;
forming a sacrificial layer on and in contact with the adhesion layer and the second portion of the substrate;
forming a switching element over the sacrificial layer and the second portion of the substrate;
enclosing the switching element within a cavity that is at least partially bound by the second portion of the substrate; and
removing the sacrificial layer.

9. A method of fabricating a MEMS device over a substrate having a first portion and a second portion, comprising:
selectively forming an adhesion layer over the first portion of the substrate;
forming a sacrificial layer over the adhesion layer and the second portion of the substrate;
forming a switching element over the sacrificial layer and the second portion of the substrate;
enclosing the switching element within a cavity that is at least partially bound by the second portion of the substrate; and
removing the sacrificial layer, wherein the adhesion layer comprises silicon.

10. A method of fabricating a MEMS device over a substrate having a first portion and a second portion, comprising:
selectively forming an adhesion layer over the first portion of the substrate;
forming a sacrificial layer over the adhesion layer and the second portion of the substrate;
forming a switching element over the sacrificial layer and the second portion of the substrate;
enclosing the switching element within a cavity that is at least partially bound by the second portion of the substrate; and
removing the sacrificial layer, wherein the adhesion layer comprises silicon, wherein the sacrificial layer comprises a dielectric material.

11. The method of claim 10, wherein the dielectric material is an organic dielectric material.

12. The method of claim 11, further comprising depositing an electrically insulating layer over the substrate prior to selectively forming the adhesion layer.

13. The method of claim 8, further comprising depositing an electrically insulating layer over the substrate prior to depositing the adhesion layer.

14. A method of fabricating a MEMS device over a substrate having a first portion and a second portion, comprising:
selectively forming an adhesion layer over the first portion of the substrate;
forming a sacrificial layer over the adhesion layer and the second portion of the substrate;
forming a switching element over the sacrificial layer and the second portion of the substrate;
enclosing the switching element within a cavity that is at least partially bound by the second portion of the substrate; and
removing the sacrificial layer, wherein the adhesion layer comprises silicon covalently bonded to an organic material.

* * * * *